(12) United States Patent
Mikasa

(10) Patent No.: US 7,851,303 B2
(45) Date of Patent: Dec. 14, 2010

(54) SEMICONDUCTOR DEVICE AND MANUFACTURING METHOD THEREOF

(75) Inventor: Noriaki Mikasa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/498,104

(22) Filed: Jul. 6, 2009

(65) Prior Publication Data

US 2010/0001331 A1    Jan. 7, 2010

(30) Foreign Application Priority Data

Jul. 4, 2008 (JP) ............................. 2008-175519

(51) Int. Cl.
*H01L 23/535* (2006.01)
*H01L 21/8242* (2006.01)
(52) U.S. Cl. ............... 438/253; 257/304; 257/E27.088
(58) Field of Classification Search ................ 438/253, 438/FOR. 220; 257/304, E27.088
See application file for complete search history.

(56) References Cited

U.S. PATENT DOCUMENTS

| | | | | |
|---|---|---|---|---|
| 6,022,776 | A * | 2/2000 | Lien et al. ................. | 438/253 |
| 7,473,954 | B2 * | 1/2009 | Jeong et al. ................ | 257/306 |
| 2007/0155115 | A1 * | 7/2007 | Horikawa .................. | 438/396 |
| 2007/0170547 | A1 * | 7/2007 | Chang et al. ............... | 257/532 |
| 2007/0187783 | A1 * | 8/2007 | Kujirai et al. .............. | 257/411 |
| 2007/0228427 | A1 * | 10/2007 | Matsui et al. .............. | 257/288 |
| 2007/0241380 | A1 * | 10/2007 | Hasunuma .................. | 257/296 |
| 2008/0099809 | A1 * | 5/2008 | Nakanishi .................. | 257/295 |
| 2008/0179652 | A1 * | 7/2008 | Sugioka ..................... | 257/306 |
| 2009/0011597 | A1 * | 1/2009 | Futase et al. ............... | 438/686 |
| 2009/0068809 | A1 * | 3/2009 | Seo et al. ................... | 438/299 |
| 2009/0218610 | A1 * | 9/2009 | Goo et al. .................. | 257/296 |

FOREIGN PATENT DOCUMENTS

JP    2007-287794    11/2007

* cited by examiner

*Primary Examiner*—George Fourson
(74) *Attorney, Agent, or Firm*—Young & Thompson

(57) ABSTRACT

A semiconductor device includes: a transistor having source and drain regions; first and second contact electrodes embedded in a first interlayer insulating film, and electrically connected to the source region and the drain region, respectively; a third electrode embedded in a second interlayer insulating film positioned in an upper layer of the first interlayer insulating film, and electrically connected to the first contact electrode; a wiring pattern embedded in a third interlayer insulating film positioned in an upper layer of the second interlayer insulating film, and electrically connected to the third contact electrode; and a fourth contact electrode embedded in at least the second and third interlayer insulating films, and electrically connected to the second contact electrode, wherein side surfaces of the wiring pattern along an extending direction of the wiring pattern coincide with side surfaces of the third contact electrode along an extending direction of the wiring pattern.

11 Claims, 14 Drawing Sheets

SEMICONDUCTOR DEVICE AND MANUFACTURING METHOD THEREOF

BACKGROUND OF THE INVENTION

1. Field of the Invention

The present invention relates to a semiconductor device and a method of manufacturing the same, and, more particularly relates to a semiconductor device in which a short circuit between a contact electrode connected to a source region of a transistor and a contact electrode connected to a drain region of the transistor is prevented, and relates to a method of manufacturing the semiconductor device.

2. Description of Related Art

Many transistors are formed on a silicon substrate that constitutes a semiconductor device. Source regions and drain regions of these transistors are connected to wirings and elements on upper layers via various contact electrodes. For example, in a DRAM (Dynamic Random Access Memory) as one of representative semiconductor devices, one of a source region and a drain region of a cell transistor is connected to a bit line, and the other region is connected to a cell capacitor as a memory element (see Japanese Patent Application Laid-open No. 2007-287794).

FIG. 14 is a schematic cross-sectional view showing a general configuration of a memory cell of a DRAM.

As shown in FIG. 14, the memory cell of the DRAM includes a cell transistor 10 and a cell capacitor 20. The cell transistor 10 includes diffusion layers 11 and 12 one of which functions as a source region and the other functions as a drain region. When a voltage exceeding a threshold value is applied to a gate electrode 13, the diffusion layers 11 and 12 are electrically connected. The cell capacitor 20 includes a lower electrode 21, an upper electrode 22, and a capacitance insulating film 23 provided between these electrodes, and holds a charge based on data to be stored.

The diffusion layer 11 is connected to a bit line 30 via a cell contact 31 and a bit contact 32. On the other hand, the diffusion layer 12 is connected to the lower electrode 21 of the cell capacitor 20 via a cell contact 41 and a capacitance contact 42.

As shown in FIG. 14, the cell contacts 31 and 41 are contact electrodes embedded in an interlayer insulating film 51. An interlayer insulating film 52 is provided on the interlayer insulating film 51, and the bit contact 32 is embedded in the interlayer insulating film 52. Further, an interlayer insulating film 53 is provided on the interlayer insulating film 52, and the bit line 30 is embedded in the interlayer insulating film 53. The capacitance contact 42 is provided by penetrating through the Interlayer insulating films 52 and 53.

In a manufacturing process of the memory cell shown in FIG. 14, after the cell transistor 10 is formed before the cell capacitor 20 is formed, the cell contacts 31 and 41, the bit contact 32, the bit line 30, and the capacitance contact 42 are formed in this order. Because these steps are performed separately, misalignment inescapably occurs between the steps. Therefore, in the manufacturing process shown in FIG. 14, a margin for the bit contact 32 shrinks particularly in the formation of the capacitance contact 42, and there is a possibility that both are in contact.

This problem occurs for a reason such that, because an upper part of the bit contact 32 has a larger diameter, when high integration progresses, the distance between the upper part of the bit contact 32 and the capacitance contact 42 becomes very small.

While conventional problems have been explained above by taking a memory cell of a DRAM as an example, these problems can similarly occur to other semiconductor devices.

SUMMARY

The present invention seeks to solve one or more of the above problems, or to improve upon those problems at least in part.

In one embodiment, there is provided a semiconductor device that includes: a transistor having a source region and a drain region; first and second contact electrodes embedded in a first interlayer insulating film, and electrically connected to the source region and the drain region, respectively; a third contact electrode embedded in a second interlayer insulating film positioned in an upper layer of the first interlayer insulating film, and electrically connected to the first contact electrode; a wiring pattern embedded in a third interlayer insulating film positioned in an upper layer of the second interlayer insulating film, and electrically connected to the third contact electrode; and a fourth contact electrode embedded in at least the second and third interlayer insulating films, and electrically connected to the second contact electrode, wherein side surfaces of the wiring pattern along an extending direction of the wiring pattern coincide with side surfaces of the third contact electrode along the extending direct ion of the wiring pattern.

In another embodiment, there is provided a semiconductor device manufacturing method that includes: forming a source region and a drain region in a semiconductor substrate; forming a first interlayer insulating film covering the source region and the drain region; forming first and second contact electrodes provided to penetrate through the first interlayer insulating film and electrically connected to one of and the other of the source region and the drain region, respectively; forming a second interlayer insulating film covering the first and second contact electrodes; forming a third contact electrode provided to penetrate through the second interlayer insulating film and electrically connected to the first contact electrode; forming a conductive material on the second interlayer insulating film so as to be electrically connected to the third contact electrode; forming a wiring pattern extended to a first direction by patterning the conductive material by using a mask; removing the third contact electrode at a part not covered by the wiring pattern, by etching the third contact electrode by using the mask; forming a third interlayer insulating film covering the wiring pattern; and forming a fourth contact electrode provided to penetrate through the second and third interlayer insulating films and electrically connected to the second contact electrode.

In still another embodiment, there is provided a semiconductor device manufacturing method that includes: forming first and second transistors sharing a gate electrode; forming a first interlayer insulating film covering the first and second transistors; forming first and second cell contacts provided to penetrate through the first interlayer insulating film and connected to a source region and a drain region of the first transistor, respectively, and forming third and fourth cell contacts connected to a source region and a drain region of the second transistor, respectively; forming a second interlayer insulating film covering the first to fourth cell contacts; exposing the first and third cell contacts by forming a line-shaped opening extended along the gate electrode, in the second interlayer insulating film; embedding a first conductive material in the opening; forming a second conductive material on the second interlayer insulating film so as to be electrically connected to the first conductive material; forming first and second bit lines passing on the first and third cell contacts, by patterning the second conductive material by using a mask; forming first and second bit contacts made of the first conductive material under the first and second bit lines, by etching the first conductive material by using the mask; forming a third interlayer insulating film covering the first and second bit lines; forming first and second memory element contacts provided to penetrate through the second and third interlayer insulating films and electrically connected to the second and fourth cell contacts, respectively; and forming on the third interlayer insulating film first and second memory elements electrically connected to the first and second memory element contacts, respectively.

According to the present invention, side surfaces of the wiring pattern along an extending direction of the wiring pattern coincide with side surfaces of the third contact electrode. Therefore, the third contact electrode and the fourth contact electrode are not directly short-circuited. Consequently, in forming the fourth contact electrode, it is sufficient to secure a margin for the wiring pattern. As a result, a formation margin of the fourth contact electrode can be increased.

Such a configuration can be obtained by removing the third contact electrode at a part not covered by the wiring pattern, by etching the third contact electrode by using a mask used to pattern the wiring pattern as it is, as described above. According to this, the third contact electrode is formed in self-aligned with the wiring pattern. Therefore, the wiring pattern and the side surfaces of the third contact electrode can be securely coincided with each other.

Accordingly, by applying the present invention to a semiconductor memory such as a DRAM, integration can be increased more than that achieved by conventional techniques.

BRIEF DESCRIPTION OF THE DRAWINGS

The above features and advantages of the present invention will be more apparent from the following description of certain preferred embodiments taken in conjunction with the accompanying drawings, in which:

FIG. 2A is a schematic cross-sectional view, FIG. 2B is a schematic cross-sectional view along a line B-B shown in FIG. 2A, and FIG. 2C is a schematic cross-sectional view along a line C-C shown in FIG. 2A;

FIG. 3A is a schematic cross-sectional view, FIG. 3B is a schematic cross-sectional view along a line B-B shown in FIG. 3A, and FIG. 3C is a schematic cross-sectional view along a line C-C shown in FIG. 3A;

FIG. 4A is a schematic cross-sectional view, FIG. 4B is a schematic cross-sectional view along a line B-B shown in FIG. 4A, and FIG. 4C is a schematic cross-sectional view along a line C-C shown in FIG. 4A;

FIG. 5A is a schematic cross-sectional view, FIG. 5B is a schematic cross-sectional view along a line B-B shown in FIG. 5A, and FIG. 5C is a schematic cross-sectional view along a line C-C shown in FIG. 5A;

FIG. 6A is a schematic cross-sectional view, FIG. 6B is a schematic cross-sectional view along a line B-B shown in FIG. 6A, and FIG. 6C is a schematic cross-sectional view along a line C-C shown in FIG. 6A;

FIG. 7A is a schematic cross-sectional view, FIG. 7B is a schematic cross-sectional view along a line B-B shown in FIG. 7A, and FIG. 7C is a schematic cross-sectional view along a line C-C shown in FIG. 7A;

FIG. 8A is a schematic cross-sectional view, FIG. 8B is a schematic cross-sectional view along a line B-B shown in FIG. 8A, and FIG. 8C is a schematic cross-sectional view along a line C-C shown in FIG. 8A;

FIG. 9A is a schematic cross-sectional view, FIG. 9B is a schematic cross-sectional view along a line B-B shown in FIG. 9A, and FIG. 9C is a schematic cross-sectional view along a line C-C shown in FIG. GA;

FIG. 10A is a schematic cross-sectional view, FIG. 10B is a schematic cross-sectional view along a line B-B shown in FIG. 10A, and FIG. 10C is a schematic cross-sectional view along a line C-C shown in FIG. 10A;

FIG. 11A is a schematic cross-sectional view, FIG. 11B is a schematic cross-sectional view along a line B-B shown in FIG. 11A, and FIG. 11C is a schematic cross-sectional view along a line C-C shown in FIG. 11A;

FIG. 12A is a schematic cross-sectional view, FIG. 12B is a schematic cross-sectional view along a line B-B shown in FIG. 12A, and FIG. 12C is a schematic cross-sectional view along a line C-C shown in FIG. 12A;

DETAILED DESCRIPTION OF THE EMBODIMENTS

Preferred embodiments of the present invention will be explained below in detail with reference to the accompanying drawings.

Figure 1:
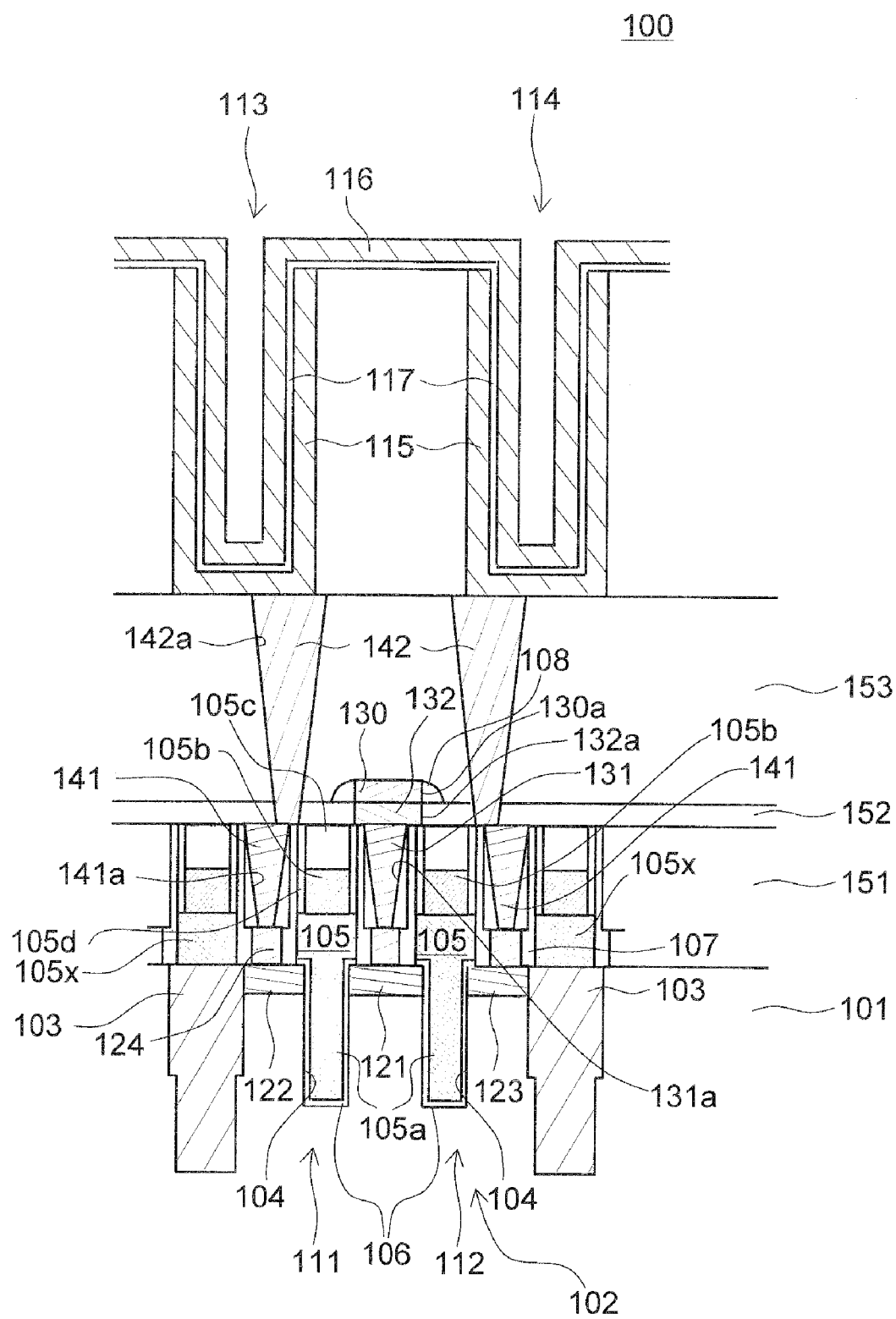
FIG. 1 is a schematic cross-sectional view showing a configuration of a semiconductor device 100 according to an embodiment of the present invention.

FIG. 1 is a schematic cross-sectional view showing a configuration of a semiconductor device 100 according to an embodiment of the present invention, and shows a cross section substantially perpendicular to an extending direction of a bit line 130. The semiconductor device 100 according to the present, embodiment is a DRAM, and FIG. 1 shows a partially enlarged memory region of the DRAM.

As shown in FIG. 1, the semiconductor device 100 according to the present embodiment includes cell transistors 111 and 112, and cell capacitors 113 and 114. The cell transistors 111 and 112 are formed in active regions 102 provided on a semiconductor substrate 101. Each active region 102 is a region isolated by an STI (Shallow Trench Isolation) region 103. The cell capacitors 113 and 114 include a lower electrode 115, an upper electrode 116, and a capacitance insulating film 117 provided between these electrodes.

Three diffusion layers 121 to 123 are formed in the active region 102. The diffusion layer 121 positioned at the center is shared by the cell transistors 111 and 112. That is, in the cell transistor 111, the diffusion layer 121 becomes one of a source region and a drain region, and the diffusion layer 122 becomes the other of the source region and the drain region. Similarly, in the cell transistor 112, the diffusion layer 121 becomes one of a source region and a drain region, and the diffusion layer 123 becomes the other of the source region and the drain region.

Although not particularly limited, in the present embodiment, the cell transistors 111 and 112 are configured by trench-gate MOS transistors. That is, two gate trenches 104 are formed in the active region 102, and a part of each gate electrode 105 is embedded in each gate trench 104 via a gate insulating film 106. Because a channel length increases based on this configuration, a short channel effect following downscaling can be suppressed.

Each gate electrode 105 has a stacked configuration including a polysilicon layer 105a, and a low resistance layer 105b having lower resistance than that of polysilicon. A refractory metal, a refractory metal silicide, nitride of a refractory metal, or a stacked unit of these materials can be used as materials of the low resistance layer 105b. An upper part of the low resistance layer 105b is covered by a gate cap 105c. Side surfaces of the low resistance layer 105b and the gate cap 105c are covered by sidewalls 105d. As shown in FIG. 1, a dummy gate electrode 105x having a configuration similar to that of the gate electrode 105 is provided at an upper part of the STI region 103.

As shown in FIG. 1, the diffusion layer 121 is connected to the bit line 130 via a cell contact 131 and a bit contact 132. On the other hand, the diffusion layers 122 and 123 are connected to the lower electrodes 115 of the cell capacitors 113 and 114, respectively via a cell contact 141 and a capacitance contact 142. Although not particularly limited, in the present embodiment, epitaxial layers 124 are formed between the diffusion layers 121 to 123 and the cell contacts 131 and 141, respectively.

The cell contacts 131 and 141 are contact electrodes embedded in an interlayer insulating film 151. The cell contacts 131 and 141 include polysilicon, for example, and are embedded in contact holes 131a and 141a formed by etching in a self-aligned manner using sidewalls 105d and 107.

An interlayer insulating film 152 is provided on the interlayer insulating film 151, and the bit contact 132 is embedded in the interlayer insulating film 152. The bit contact 132 includes a refractory metal such as tungsten (W), for example. An interlayer insulating film 153 is provided on the interlayer insulating film 152, and the bit line 130 is embedded in the interlayer insulating film 153. The bit line 130 includes a refractory metal such as tungsten (W), for example. Preferably, the bit line 130 and the bit contact 132 use the same conductive material. However, when the bit contact 132 has a multilayer structure, a material of at least a top layer of the multilayer film constituting the bit contact 13 preferably has the same material as that of the bit line 130.

The capacitance contact 142 is provided to penetrate through the interlayer insulating films 152 and 153. The capacitance contact 142 includes polysilicon, for example, and is formed within a contact hole 142a formed not to be in contact with the bit line 130 and the bit contact 132.

As described above, FIG. 1 has a cross section substantially perpendicular to an extending direction of the bit line 130. Therefore, side surfaces 130a and 132a of the bit line 130 and the bit contact 132 shown in FIG. 1 are the side surfaces along the extending direction of the bit line 130. As shown in FIG. 1, these side surfaces 130a and 132a horizontally coincide with each other, that is, coincide with each other in a direction perpendicular to a main surface of the semiconductor substrate 101. That is, the side surfaces 130a and 132a constitute the same plane. Therefore, a width of the bit contact 132 in a direction substantially perpendicular to the extending direction of the bit line 130 coincides with a width of the bit line 130, and an upper surface of the bit contact 132 is completely covered by the bit line 130.

While details are described later, this configuration can be obtained by over-etching at the time of patterning the bit line 130. That is, this configuration can be obtained by patterning the bit contact 132 in self-aligned with the bit line 130.

When the capacitance contact 142 is formed at least so as not be in contact with the bit line 130 based on this configuration, the capacitance contact 142 and the bit contact 132 are not directly in contact with each other. That is, in forming the capacitance contact 142, a contact between the capacitance contact 142 and the bit contact 132 does not need to be considered. Therefore, a formation margin of the capacitance contact 142 can be increased more than that of conventional techniques.

A method of manufacturing the semiconductor device 100 according to the present embodiment is explained next.

FIGS. 2A to 2C to FIGS. 12A to 12C are process diagrams for explaining the method of manufacturing the semiconductor device 100 according to the present embodiment, where each diagram of "A" is a schematic cross-sectional view, each diagram of "B" is a schematic cross-sectional view along a line B-B shown in "A", and each diagram of "C" is a schematic cross-sectional view along a line C-C shown in "A".

Figure 2A:
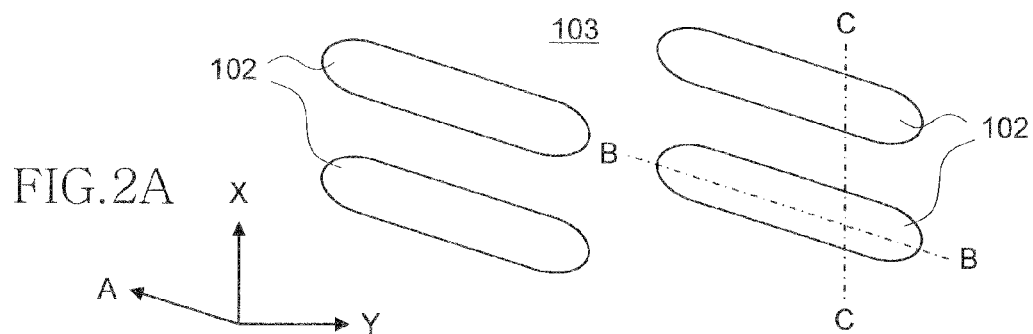
FIGS. 2A to 2C are process diagrams for explaining one process (formation of an STI region 103) of the method of manufacturing the semiconductor device 100, where
Figure 2B:
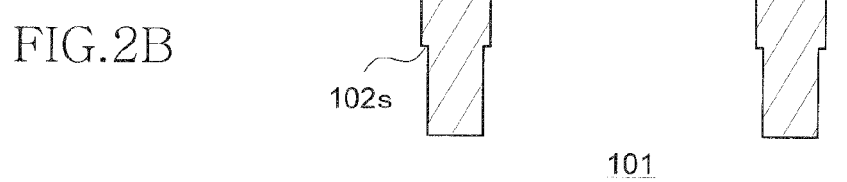
Figure 2C:
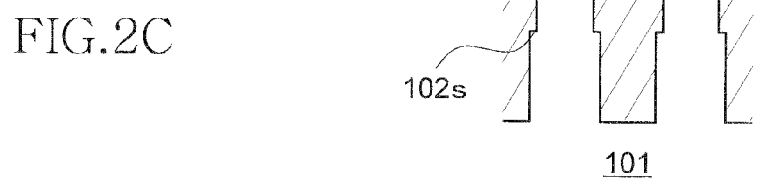

First, as shown in FIGS. 2A to 2C, the STI region 103 is formed on the semiconductor substrate 101, thereby forming the active regions 102. Each active region 102 has approximately a belt shape having a predetermined length in planar view. A longitudinal direction of the active region 102 is formed along an A direction having a predetermined angle (for example, 18°) slightly inclined to a Y direction orthogonal to an X direction which is an extending direction of a word line described later. The STI region 103 is formed by having an insulation material such as silicon oxide embedded in a trench formed in the semiconductor substrate 101.

As shown in FIGS. 2A to 2C, each active region 102 has a larger diameter at a lower part, has a smaller diameter at an upper part, and has a stepped shape. To obtain this shape, a trench to form the STI region 103 is formed at two stages. While not particularly limited, preferably, each height of the lower part and the upper part of the active region 102 is set at about 100 nm, and a width of a step 102s formed at a boundary between the lower part and the upper part is set at about 15 nm.

Figure 3A:
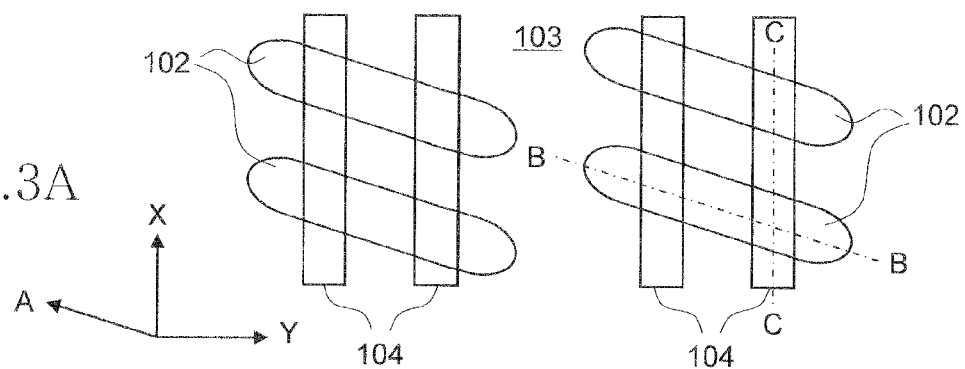
FIGS. 3A to 3C are process diagrams for explaining one process (formation of gate trenches 104) of the method of manufacturing the semiconductor device 100, where
Figure 3B:
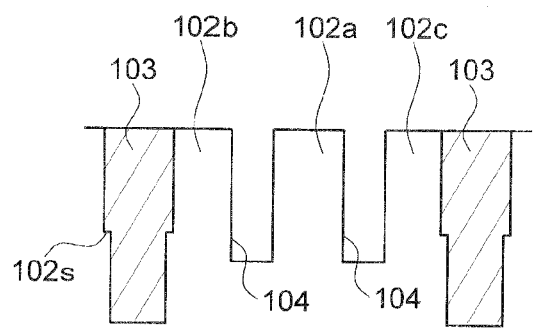
Figure 3C:
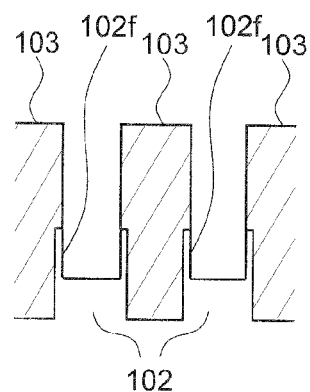

Next, as shown in FIGS. 3A to 3C, the gate trenches 104 are formed along the X direction. Two gate trenches 104 are formed in one active region 102. Accordingly, the active regions 102 are isolated to three regions 102a to 102c. The gate trenches 104 are formed at least deeper than the steps 102s. Accordingly, at a part where the gate trench 104 is formed, the upper part of the active region 102 is completely removed, and the lower part of the active region 102 becomes a fin-shaped region 102f. When the active region 102 has the above size, a depth of the gate trench 104 is set preferably at about 150 nm. In this case, a height of the fin-shaped region 102f becomes about 50 nm, and a width becomes about 15 nm.

Figure 4A:
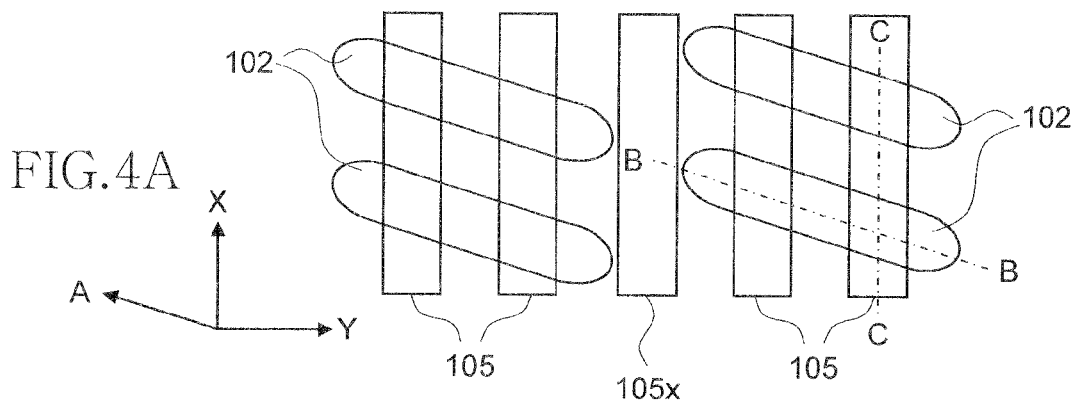
FIGS. 4A to 4C are process diagrams for explaining one process (formation of a gate electrode 105) of the method of manufacturing the semiconductor device 100, where
Figure 4B:
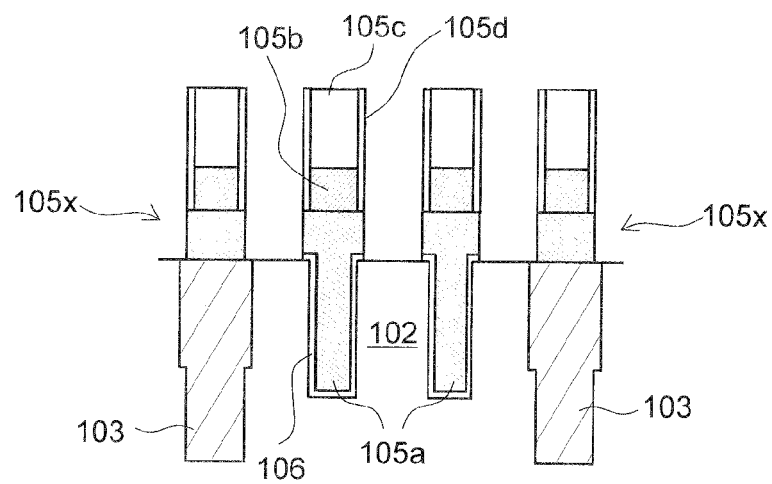
Figure 4C:
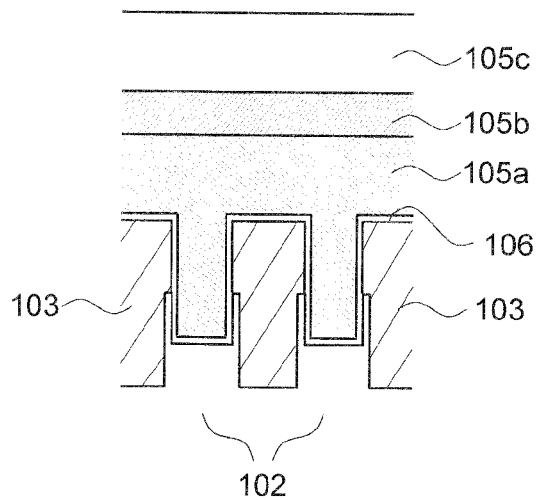

Next, as shown in FIGS. 4A to 4C, the gate electrodes 105 are formed. In forming each gate electrode 105, the gate insulating film 106 is first formed on an inner wall of the gate trench 104. The polysilicon layer 105a is then formed on the whole surface, thereby completely filling the gate trench 104. The low resistance layer 105b is formed on an upper part of the polysilicon layer 105a. As described above, a refractory metal, a refractory metal silicide, nitride of a refractory metal, or a stacked unit of these materials can be used as materials of the low resistance layer 105b. The gate cap 105c made of silicon nitride is formed on an upper part of the low resistance layer 105b, and the low resistance layer 105b is patterned by using this gate cap 105c. After a silicon nitride film is formed on the whole surface, this is etched back, thereby forming the sidewalls 105d on side surfaces of the low resistance layer 105b and the gate cap 105c. The polysilicon layer 105a is patterned by using the gate cap 105c and the sidewalls 105d as masks, thereby forming the gate electrode 105.

In the formation process of the gate electrode 105, the dummy gate electrode 105x is also formed on the STI region 103 where the gate trench 104 is not formed. The dummy gate electrode 105x is formed to set formation density of the gate electrode constant.

Figure 5A:
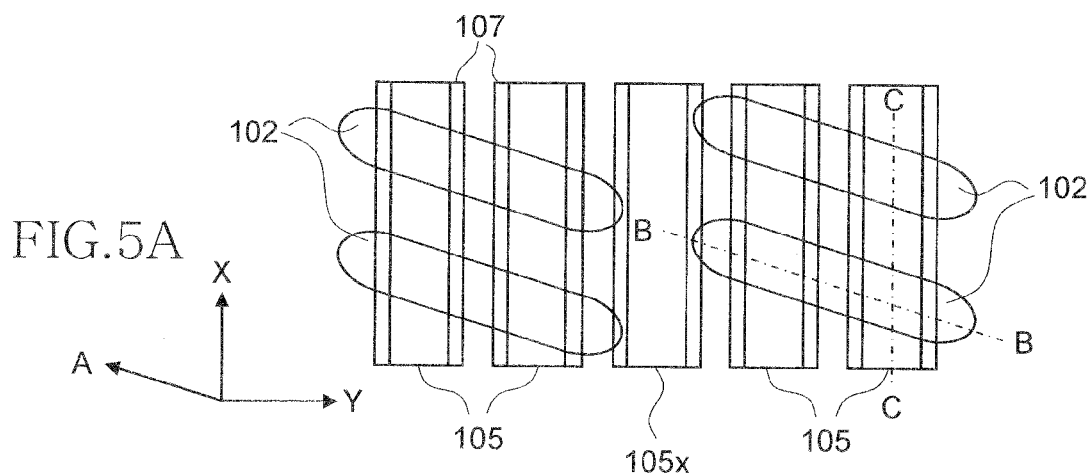
FIGS. 5A to 5C are process diagrams for explaining one process (formation of sidewalls 105d and 107) of the method of manufacturing the semiconductor device 100, where
Figure 5B:
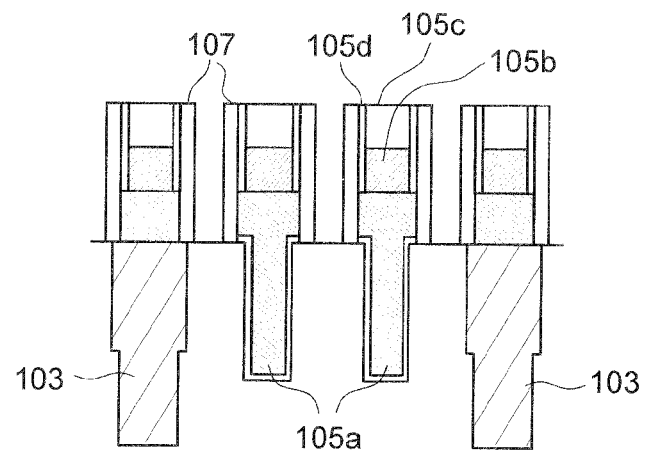
Figure 5C:
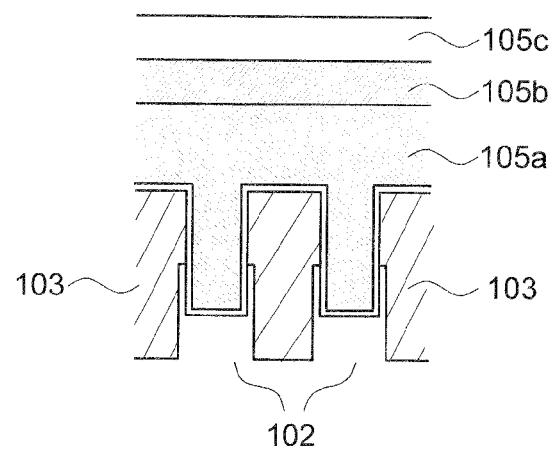
Figure 6A:
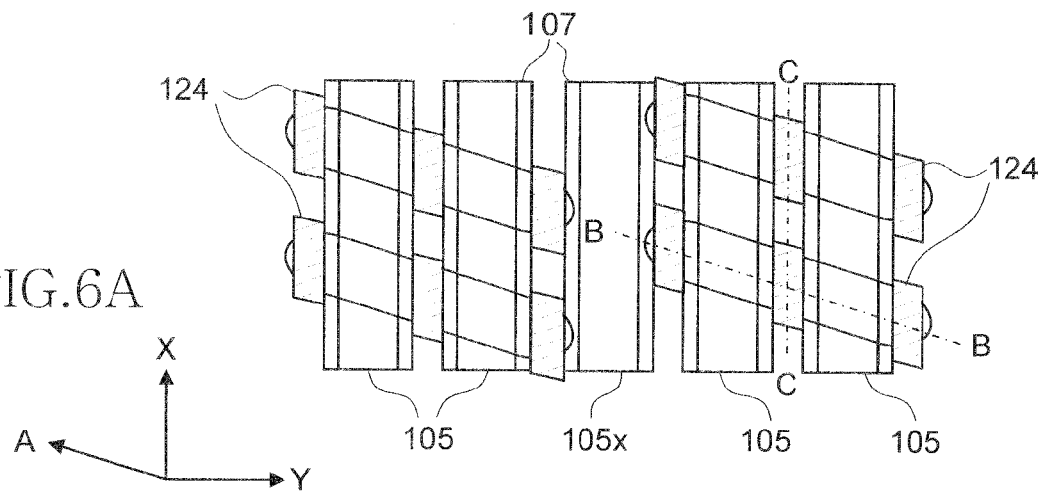
FIGS. 6A to 6C are process diagrams for explaining one process (formation of an epitaxial layer 124) of the method of manufacturing the semiconductor device 100, where
Figure 6B:
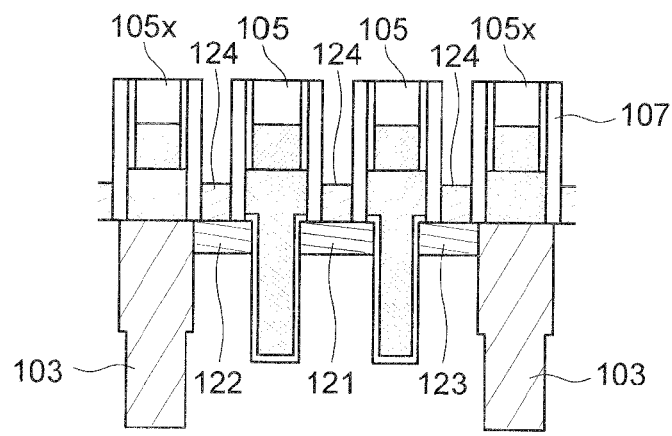
Figure 6C:
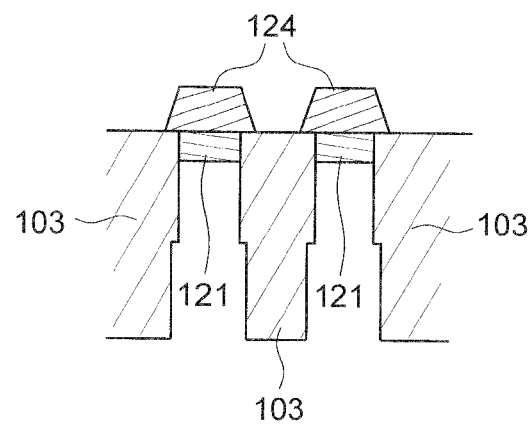

Next, as shown in FIGS. 5A to 5C, a silicon nitride film is formed on the whole surface, and this is etched back to form the sidewalls 107 on side surfaces of the gate electrode 105 and the dummy gate electrode 105x. Next, as shown in FIGS. 6A to 6C, the epitaxial layers 124 are formed at exposed parts of the active region 102, respectively. The epitaxial layer 124 grows not only in a vertical direction but also in a horizontal direction. Therefore, the epitaxial layer 124 needs to be formed so as not to be short-circuited with the adjacent epitaxial layer 124 in the X direction.

Dopant is introduced into the epitaxial layer 124 by ion implantation. Accordingly, the diffusion layers 121 to 123 are formed in the three regions 102a to 102c constituting the active region 102, respectively.

Figure 7A:
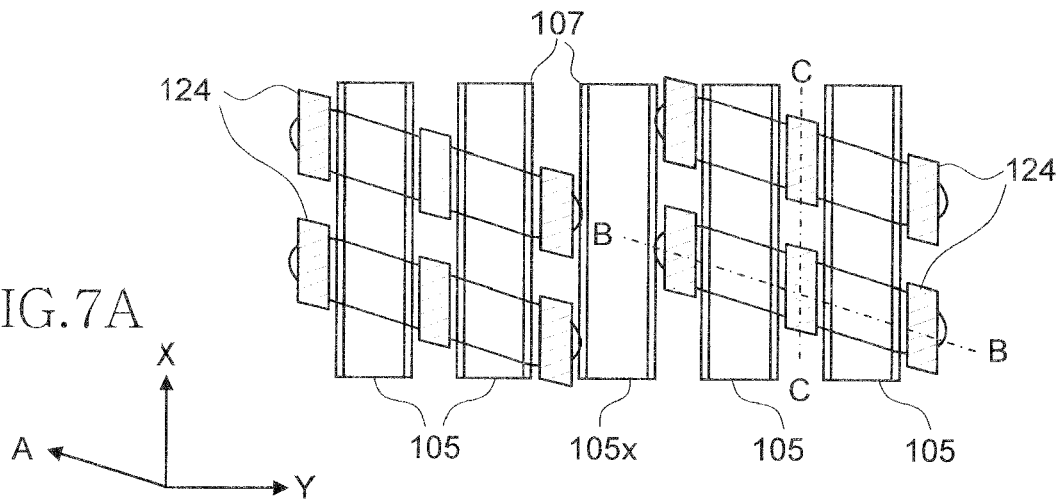
FIGS. 7A to 7C are process diagrams for explaining one process (etching of the side walls 107) of the method of manufacturing the semiconductor device 100, where
Figure 7B:
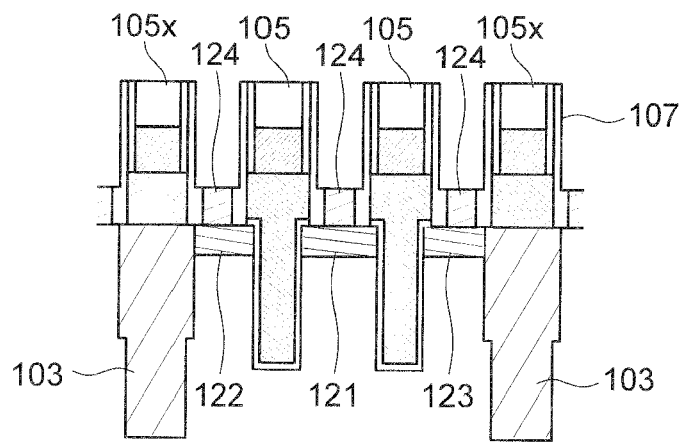
Figure 7C:
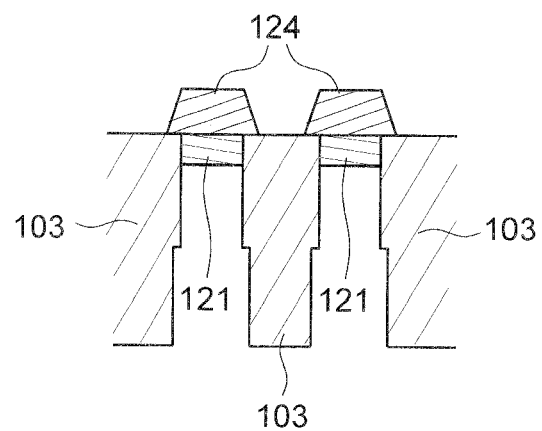
Figure 8A:
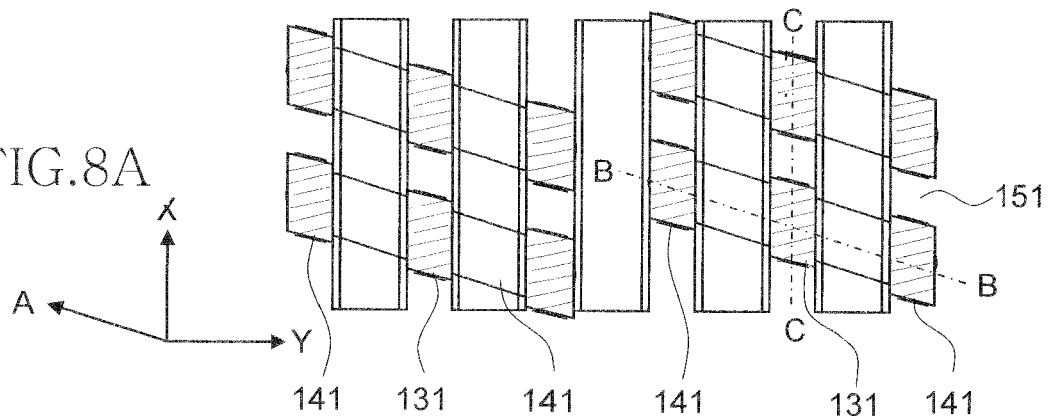
FIGS. 8A to 8C are process diagrams for explaining one process (formation of cell contacts 131, 141) of the method of manufacturing the semiconductor device 100, where
Figure 8B:
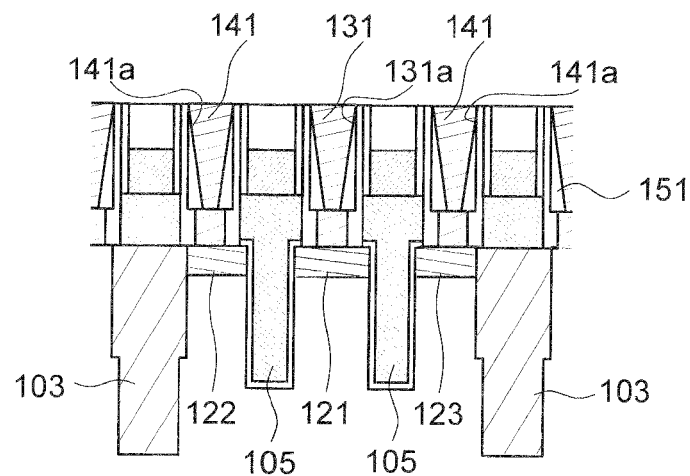
Figure 8C:
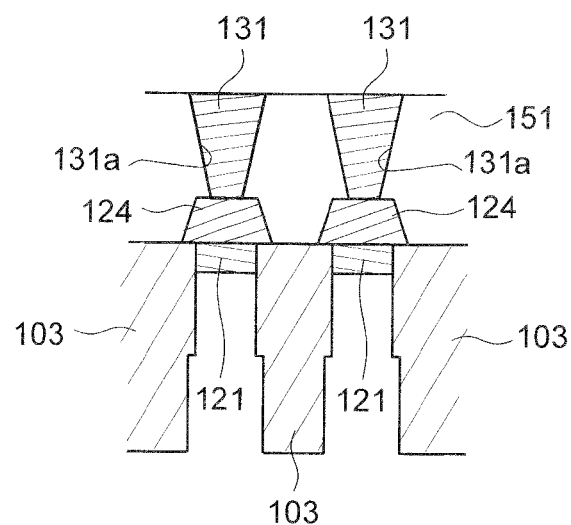

Next, as shown in FIGS. 7A to 7C, a film thickness of the sidewall 107 is decreased by wet etching. To prevent diffusion of impurity from BPSG (Boro-Phospho Silicate Glass) used for the interlayer insulating film 151 to the epitaxial layer 124, a silicon nitride film (not shown) having a film thickness of about 10 nm is formed. Thereafter, as shown in FIGS. 8A to 8C, the interlayer insulating film 151 made of BPSG is embedded between the gate electrodes. The contact holes 131a and 141a are formed in the interlayer insulating film 151, thereby exposing the epitaxial layers 124. A conductive material such as DOPOS (Doped Polysilicon) is embedded in the contact holes 131a and 141a, thereby forming the cell contacts 131 and 141. The contact holes 131a and 141a can be formed by photolithography and etching by using a resist mask. The cell contacts 131 and 141 are formed by depositing DOPOS in the whole surface of the substrate including the inside of the contact holes 131a and 141a, polishing the DOPOS by a CMP method, and by leaving the DOPOS at only the inside of the contact holes 131a and 141a.

Figure 9A:
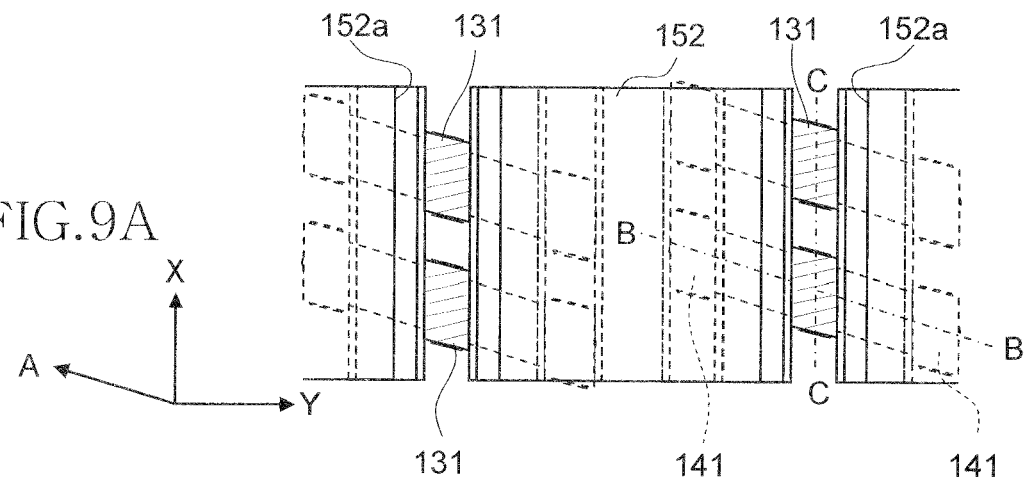
FIGS. 9A to 9C are process diagrams for explaining one process (formation of an interlayer insulating film 152 and openings 152a) of the method of manufacturing the semiconductor device 100, where
Figure 9B:
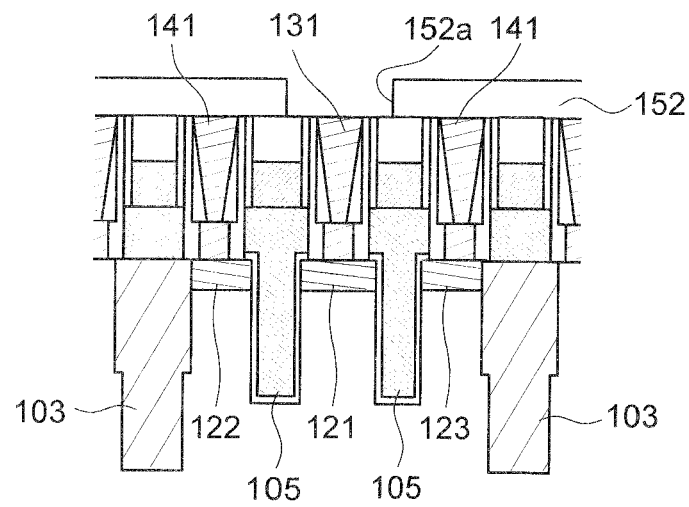
Figure 9C:
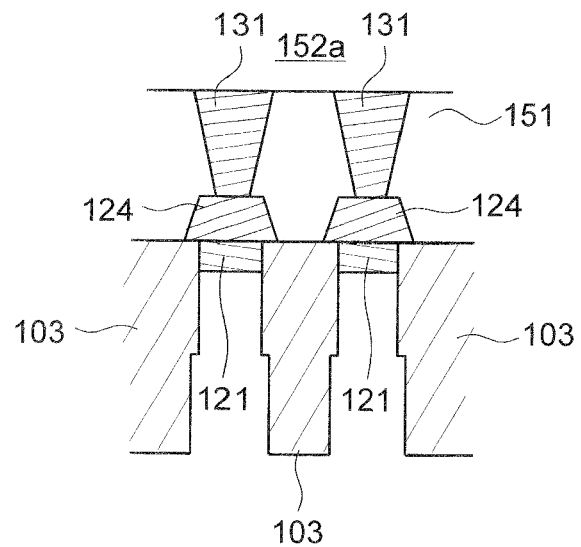

Next, as shown in FIGS. 9A to 9C, the interlayer insulating film 152 including a silicon oxide film is formed on the whole surface. Line-shaped openings 152a extended to the X direction are formed in the interlayer insulating film 152 so that a region corresponding to the cell contact 131 is exposed. Accordingly, the cell contacts 141 are covered by the interlayer insulating film 152, and the cell contacts 131 are exposed. Because the openings 152a have the line shape extended to the X direction, the plural cell contacts 131 arranged in the X direction are exposed by the same openings 152a. A width of each opening 152a in the Y direction is set larger than a width of the bit line 130 formed thereafter in the X direction. Preferably, the width of each opening 152a is set equal to or larger than two times, and more preferably, three times, of the width of the bit line 130 in the X direction. For example, when a width of the bit line 130 is set at 38 nm, a width of the opening 152a is set at about 120 nm.

Figure 10A:
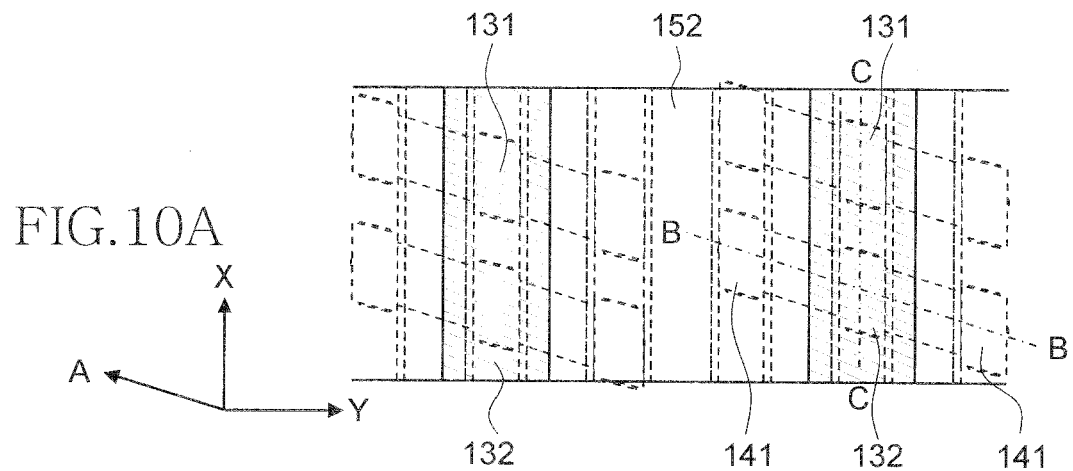
FIGS. 10A to 10C are process diagrams for explaining one process (formation of a bit contact 132) of the method of manufacturing the semiconductor device 100, where
Figure 10B:
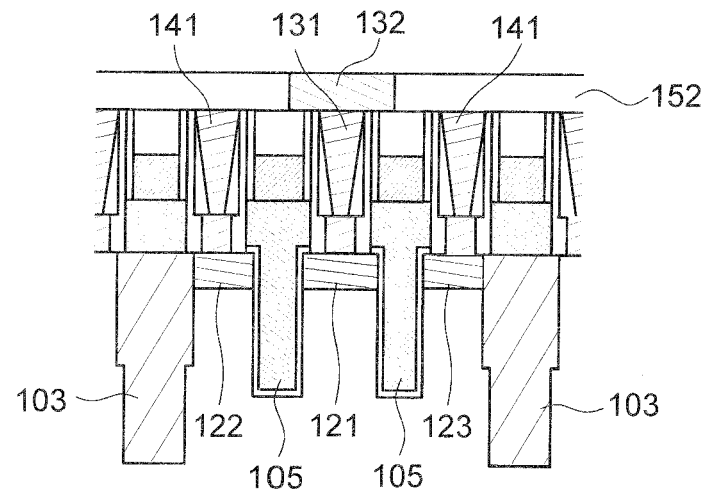
Figure 10C:
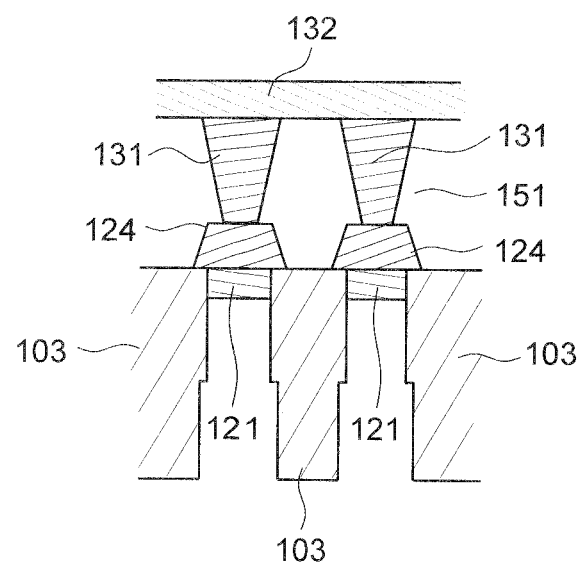

As shown in FIGS. 10A to 10C, a conductive material including a refractory metal such as tungsten (W) is formed on the whole surface, and then the refractory material is left only within the openings 152a by polishing the conductive material by the CMP method. Accordingly, the bit contacts 132 are formed within the opening 152a. As described above, because the opening 152a is in the line shape, at this state, the plural cell contacts 131 arranged in the X direction are short-circuited by the line-shaped bit contact 132.

Figure 11A:
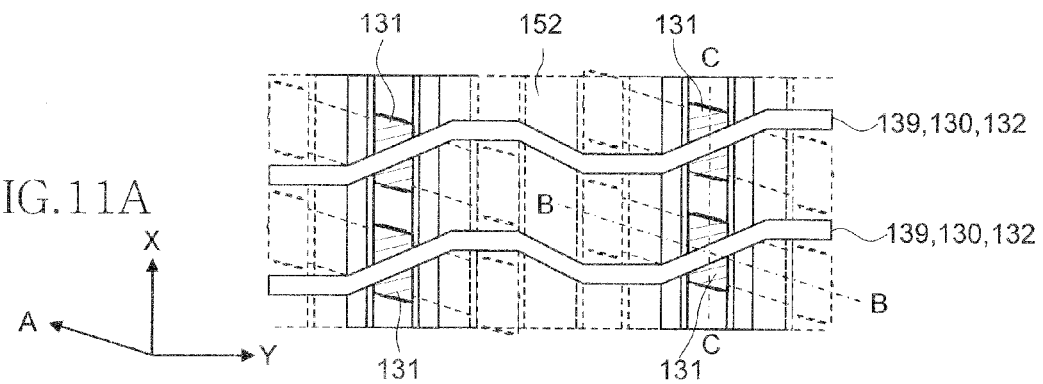
FIGS. 11A to 11C are process diagrams for explaining one process (formation of a bit line 130) of the method of manufacturing the semiconductor device 100, where
Figure 11B:
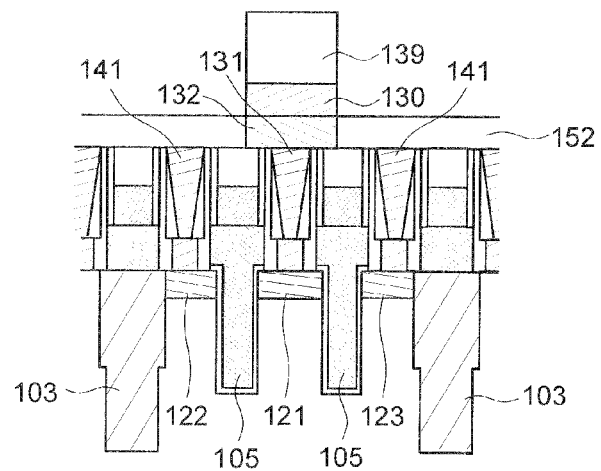
Figure 11C:
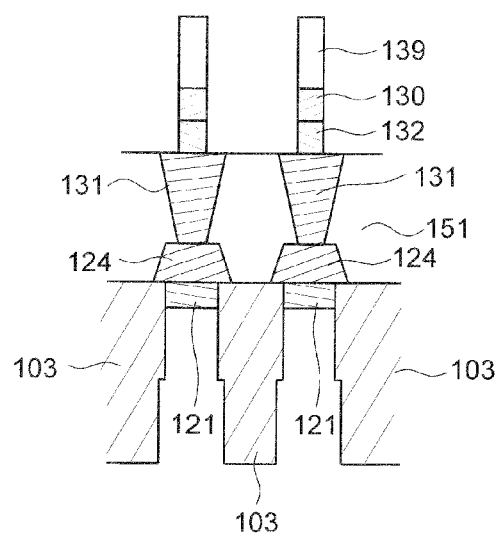

Next, as shown in FIGS. 11A to 11C, a conductive material including a refractory metal such as tungsten (W) is formed on the whole surface, and then the conductive material is patterned by using a mask 139 made of a silicon nitride film, thereby forming the bit lines 130. The bit line 130 is wired to pass on the bit contact 132, and in a meandering manner by not passing above the cell contact 141.

In patterning the bit line 130, the bit contact 132 exposed is also completely removed by over-etching. That is, the bit contact 132 is continuously patterned by using the same mask as the mask 139 used to pattern the bit line 130. Accordingly, the bit contact 132 remains at only a lower part of the bit line 130, and the bit contacts 132 adjacent are electrically isolated. This continuous patterning can be easily performed by configuring the bit line 130 and the bit contact 132 using the same conductive material.

Accordingly, a width of the bit contact 132 in the X direction coincides with a width (38 nm, for example) of the bit line 130, and a width of the bit contact 132 in the Y direction coincides with a width (120 nm, for example) of the opening 152a. Consequently, the bit contact 132 has the width in the X direction sufficiently larger than the width in the Y direction. As a result, a contact area of the bit contact 132 and the cell contact 131 is sufficiently secured, and electric resistance at an interface can be decreased.

Figure 12A:
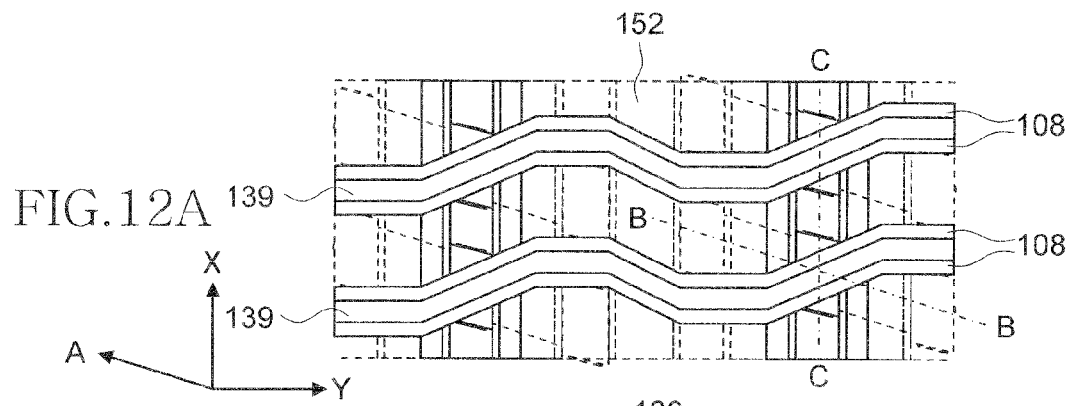
FIGS. 12A to 12C are process diagrams for explaining one process (formation of a sidewall 108) of the method of manufacturing the semiconductor device 100, where
Figure 12B:
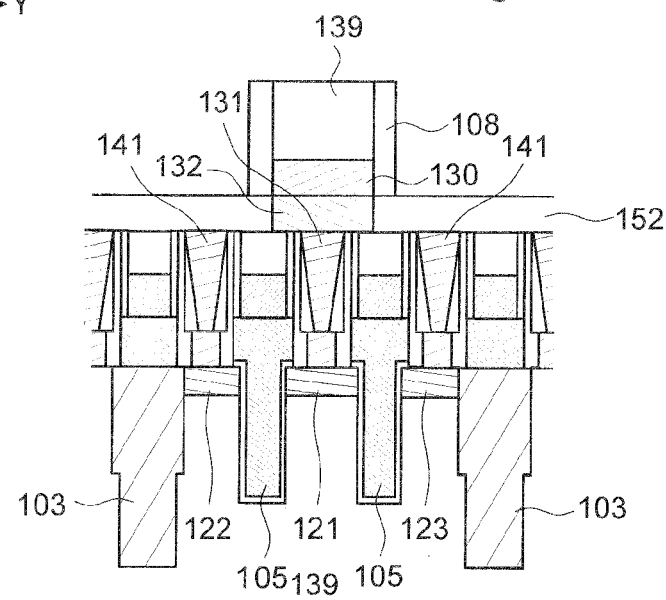
Figure 12C:
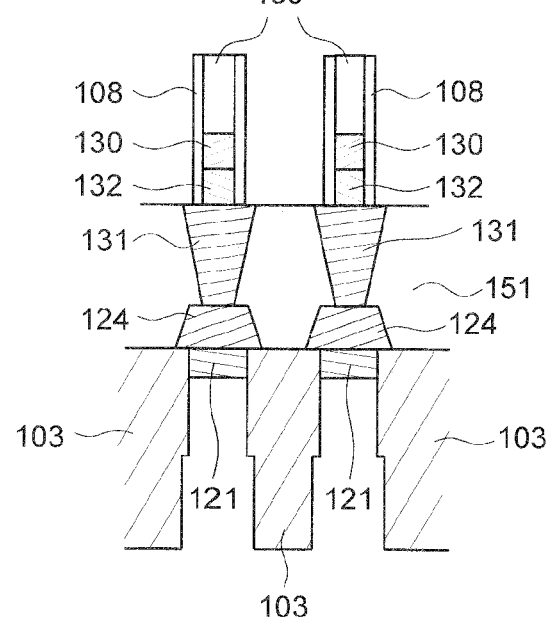

Next, as shown in FIGS. 12A to 12C, a silicon nitride film is formed on the whole surface, and then, this is etched back, thereby forming sidewalls 108 on side surfaces of the bit line 130. Next, after the interlayer insulation film 153 made of BPSG or the like is formed as shown in FIG. 1, the contact holes 142a for the capacitance contacts 142 are formed, and they are filled by a conductive material such as DOPOS, thereby forming the capacitance contacts 142.

According to a conventional manufacturing method, at the time of forming the contact hole 142a, the margin needs to be secured for both the bit line 130 and the bit contact 132. On the other hand, according to the manufacturing method of the present embodiment, because the bit contact 132 is formed in self-aligned with the bit line 130, the capacitance contact 142 and the bit contact 132 are not directly short-circuited. Therefore, to form the contact hole 142a, it is sufficient to secure a margin for the bit line 130. That is, the formation margin of the capacitance contact 142 can be increased.

Thereafter, as shown in FIG. 1, the cell capacitors 113 and 114 as memory elements are formed at an upper part of the capacitance contacts 142, thereby completing the semiconductor device 100 according to the present embodiment.

As explained above, according to the present embodiment, the bit contact 132 is continuously patterned by using the same mask 139 as that used to pattern the bit line 130. Therefore, the bit contact 132 at a part not covered by the bit line 130 is completely removed. Accordingly, the upper surface of the bit contact 132 is entirely covered by the bit line 130. Consequently, even when misalignment occurs, the bit contact 132 and the capacitance contact 142 are not directly short-circuited. As a result, the formation margin of the capacitance contact 142 increases, and further downscaling can be performed.

It is apparent that the present invention is not limited to the above embodiments, but may be modified and changed without departing from the scope and spirit of the invention.

Figure 13A:
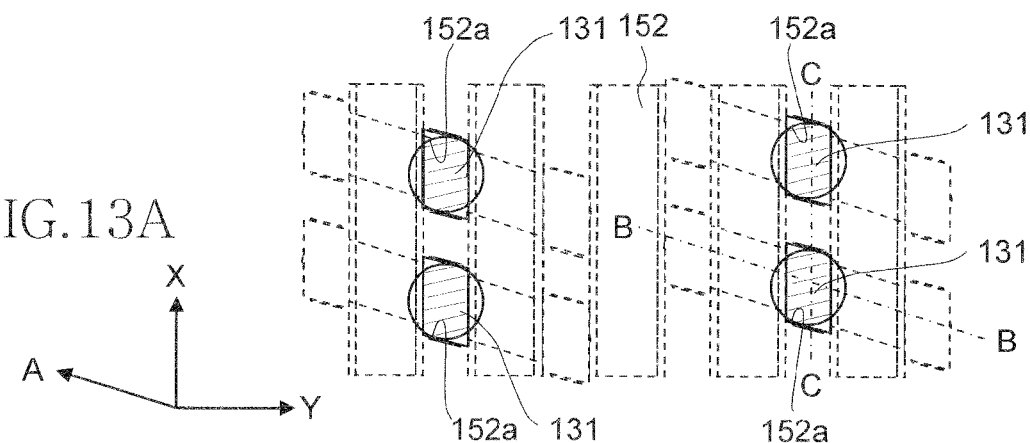
FIGS. 13A to 13P are process diagrams for explaining a modified example of the process shown in FIGS. 9A to 9C.
Figure 13B:
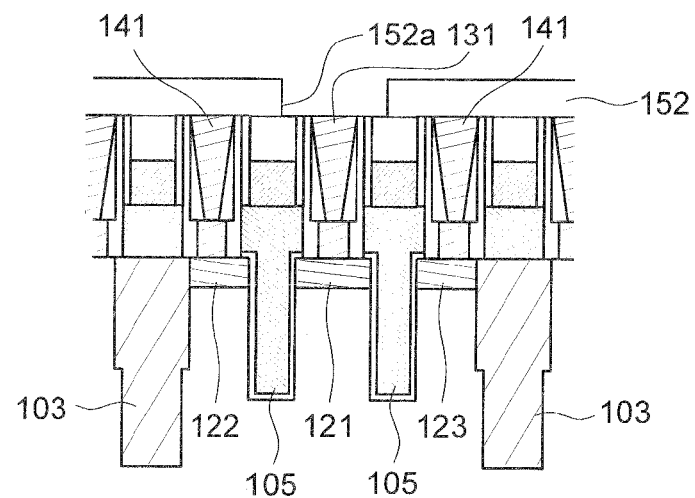
Figure 13C:
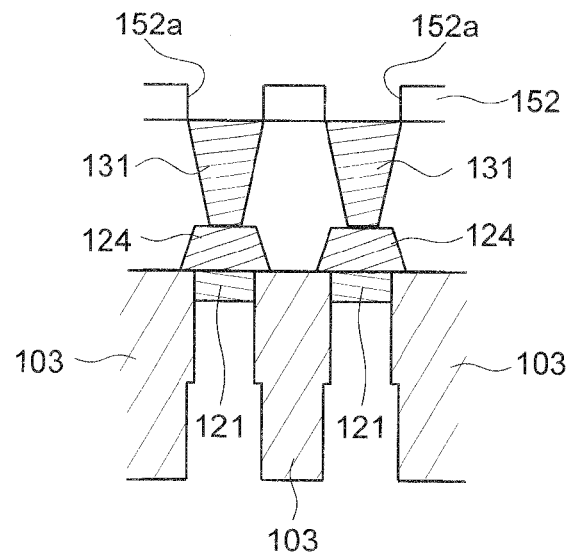
Figure 14:
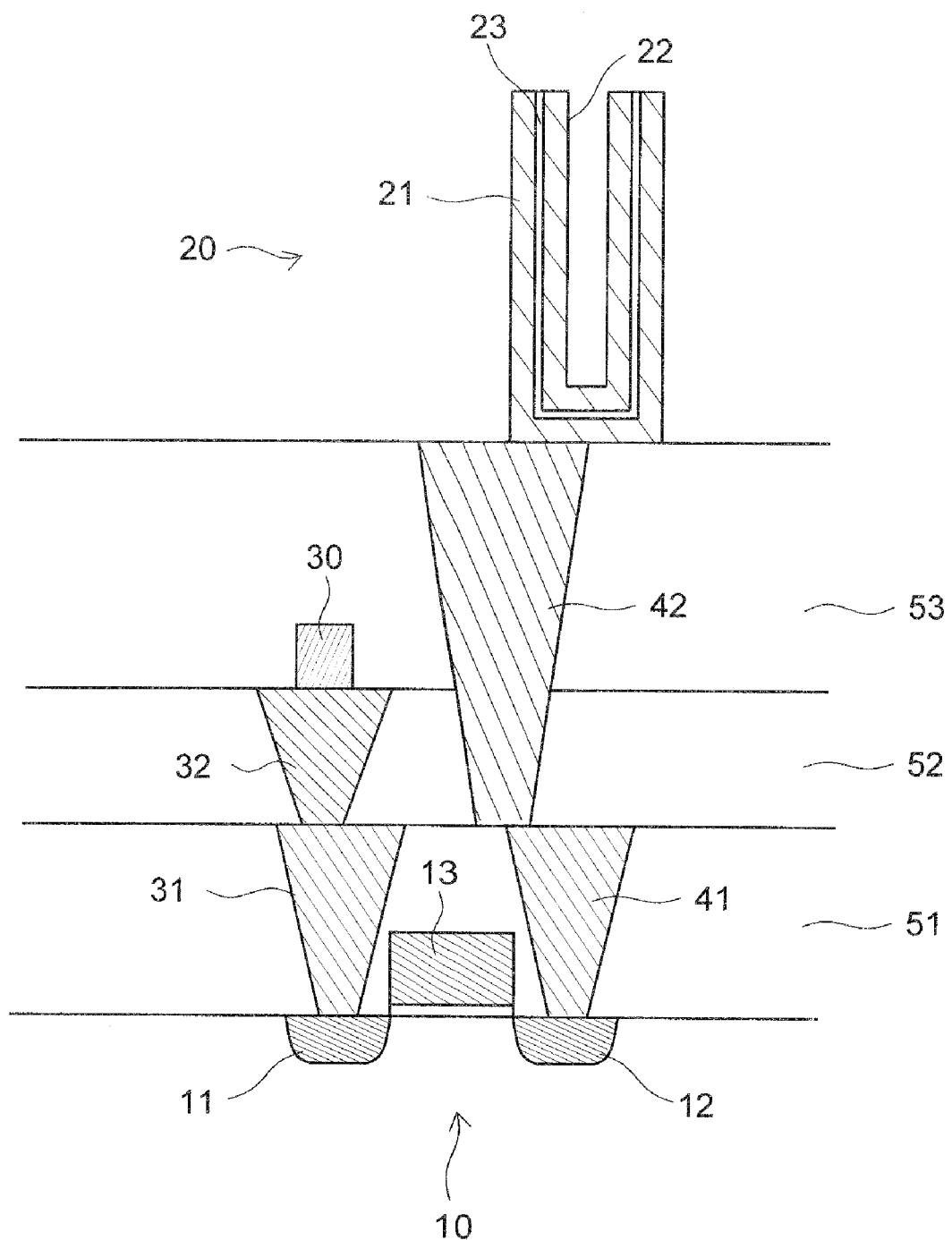
FIG. 14 is a schematic cross-sectional view showing a general configuration of a memory cell of a DRAM.

For example, in the above embodiment, while the opening 152a to form the bit contact 132 has a line shape extended to the X direction, the present invention is riot limited thereto, and the cell contacts 131 can be individually disclosed as shown in FIGS. 13A to 13C. However, when downscaling is progressed, openings to individually expose the cell contacts 131 cannot be easily formed correctly at right positions. Therefore, the opening 152a preferably has a shape extended in a line shape as shown in the embodiment.

In the above embodiment, while the present invention is applied to a memory cell of a DRAM, the present invention is not limited to this, and can be applied to other types of semiconductor memories such as a PRAM and an RRAM, and can be also applied to a semiconductor device of a logic system such as a processor. When the present invention is applied to a PRAM, for example, a phase-change memory element can be used instead of the cell capacitor shown in FIG. 1.

In the above embodiment, while a trench-gate transistor is used, a configuration of a transistor used in the present invention is not limited thereto. Therefore, a general planar transistor can be used, or a three-dimensional transistor using a fin-shaped or pillar-shaped silicon can be used.

In the above embodiment, while DOPOS is used as a material of the cell contacts 131 and 141 and the capacitance contact 142, a refractory metal such as tungsten (W) can be used instead of DOPOS. When tungsten (W) or the like is used as a material of the cell contacts 131 and 141, after the epitaxial layer 124 at a lower layer is exposed, a barrier film including a metal silicide film and titanium nitride is stacked on the surface of the epitaxial layer 124. Thereafter, tungsten (W) is filled in the contact holes 131a and 141a, thereby forming the cell contacts 131 and 141. When a refractory metal such as tungsten (W) is used as a material of the cell contacts 131 and 141, electric resistance of the cell contacts 131 and 141 is decreased. Therefore, when the present invention is applied to a memory cell of a DRAM, reliability of a DRAM operation can be improved and its operation speed can be increased.

What is claimed is:

1. A method of manufacturing a semiconductor device comprising:
    forming a source region and a drain region in a semiconductor substrate;
    forming a first interlayer insulating film covering the source region and the drain region;
    forming first and second contact electrodes provided to penetrate through the first interlayer insulating film and electrically connected to one of and the other of the source region and the drain region, respectively;
    forming a second interlayer insulating film covering the first and second contact electrodes;
    forming a third contact electrode provided to penetrate through the second interlayer insulating film and electrically connected to the first contact electrode;
    forming a conductive material on the second interlayer insulating film so as to be electrically connected to the third contact electrode;
    forming a wiring pattern extended to a first direction by patterning the conductive material by using a mask;
    removing the third contact electrode at a part not covered by the wiring pattern, by etching the third contact electrode by using the mask;
    forming a third interlayer insulating film covering the wiring pattern; and
    forming a fourth contact electrode provided to penetrate through the second and third interlayer insulating films and electrically connected to the second contact electrode.

2. The method of manufacturing the semiconductor device as claimed in claim 1, wherein forming the third contact electrode includes a step of forming a line-shaped opening extended to a second direction crossing the first direction, in the second interlayer insulating film, and embedding a third contact electrode in the opening.

3. The method of manufacturing the semiconductor device as claimed in claim 1, further comprising forming a memory element electrically connected to the fourth contact electrode, on the third interlayer insulating film.

4. A method of manufacturing a semiconductor device comprising:
    forming first and second transistors sharing a gate electrode;
    forming a first interlayer insulating film covering the first and second transistors;
    forming first and second cell contacts provided to penetrate through the first interlayer insulating film and connected to a source region and a drain region of the first transistor, respectively, and forming third and fourth cell contacts connected to a source region and a drain region of the second transistor, respectively;
    forming a second interlayer insulating film covering the first to fourth cell contacts;
    exposing the first and third cell contacts by forming a line-shaped opening extended along the gate electrode, in the second interlayer insulating film;
    embedding a first conductive material in the opening;
    forming a second conductive material on the second interlayer insulating film so as to be electrically connected to the first conductive material;
    forming first and second bit lines passing on the first and third cell contacts, by patterning the second conductive material by using a mask;
    forming first and second bit contacts made of the first conductive material under the first and second bit lines, by etching the first conductive material by using the mask;
    forming a third interlayer insulating film covering the first and second bit lines;
    forming first and second memory element contacts provided to penetrate through the second and third interlayer insulating films and electrically connected to the second and fourth cell contacts, respectively; and forming on the third interlayer insulating film first and second memory elements electrically connected to the first and second memory element contacts, respectively.

5. The method of manufacturing the semiconductor device as claimed in claim 4, wherein the first and second bit lines are formed in parallel with each other so as to cross the gate electrode.

6. The method of manufacturing the semiconductor device as claimed in claim 4, wherein the first and second bit lines are formed in a meandering manner so as not to pass above the second and fourth cell contacts.

7. The method of manufacturing the semiconductor device as claimed in claim 1, wherein forming the third contact electrode comprises:

forming a contact hole penetrating the second interlayer insulating film, the contact hole being disposed on the first contact electrode; and filling a conductive material into the contact hole, the conductive material being used as the third contact electrode.

8. The method of manufacturing the semiconductor device as claimed in claim 1, wherein forming the source region and the drain region comprises:

forming epitaxial layers on the semiconductor substrate, each of the epitaxial layers being disposed on corresponding one of the source region and the drain region, respectively; and introducing dopant into the epitaxial layers by ion implantation.

9. The method of manufacturing the semiconductor device as claimed in claim 1, further comprising forming sidewalls of an insulating film on side surfaces of the wiring pattern between removing the third contact electrode and forming the third interlayer insulating film.

10. The method of manufacturing the semiconductor device as claimed in claim 4, further comprising forming sidewalls of an insulating film on side surfaces of each of the first and second bit lines between forming first and second bit contacts and forming the third interlayer insulating film.

11. The method of manufacturing the semiconductor device as claimed in claim 4, wherein forming the first and second memory elements comprises forming capacitors on the third interlayer insulating film.

* * * * *